United States Patent
Liu et al.

(10) Patent No.: US 9,607,988 B2
(45) Date of Patent: Mar. 28, 2017

(54) OFF-CENTER GATE CUT

(71) Applicant: QUALCOMM Incorporated, San Diego, CA (US)

(72) Inventors: Yanxiang Liu, Glenville, NY (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/611,090

(22) Filed: Jan. 30, 2015

(65) Prior Publication Data

US 2016/0225767 A1 Aug. 4, 2016

(51) Int. Cl.
*H01L 21/70* (2006.01)
*H01L 27/092* (2006.01)
*H01L 27/02* (2006.01)
*H01L 21/8238* (2006.01)
*H01L 29/08* (2006.01)

(52) U.S. Cl.
CPC .... *H01L 27/092* (2013.01); *H01L 21/823828* (2013.01); *H01L 21/823871* (2013.01); *H01L 27/0207* (2013.01); *H01L 29/0847* (2013.01)

(58) Field of Classification Search
CPC .......... H01L 27/092; H01L 21/823828; H01L 21/823871; H01L 29/0847; H01L 29/66545
USPC ...................................... 257/369
See application file for complete search history.

(56) References Cited

U.S. PATENT DOCUMENTS

| | | |
|---|---|---|
| 6,096,609 A | 8/2000 | Kim et al. |
| 8,664,725 B1 | 3/2014 | Venkitachalam et al. |
| 8,836,040 B2 | 9/2014 | Kamal et al. |
| 8,869,085 B2 | 10/2014 | Lu |
| 2006/0128082 A1 | 6/2006 | Chuang et al. |
| 2006/0220066 A1* | 10/2006 | Yoshida .............. H01L 23/5222 257/204 |
| 2008/0169487 A1 | 7/2008 | Shimbo et al. |
| 2008/0283871 A1 | 11/2008 | Hamada |
| 2009/0184379 A1* | 7/2009 | Ota ................. H01L 21/823437 257/401 |
| 2010/0182392 A1 | 7/2010 | Nagumo |
| 2014/0124868 A1* | 5/2014 | Kamal ............... H01L 27/0207 257/369 |
| 2014/0167172 A1 | 6/2014 | Chen et al. |

FOREIGN PATENT DOCUMENTS

JP 2007123442 A 5/2007
WO 2013106799 A1 7/2013

OTHER PUBLICATIONS

International Search Report and Written Opinion—PCT/US2016/013214 ISA/EPO-Apr. 1, 2016 (146774WO).

* cited by examiner

*Primary Examiner* — Tu-Tu Ho
(74) *Attorney, Agent, or Firm* — Toler Law Group, PC

(57) ABSTRACT

A semiconductor device includes a diffusion area, a gate structure coupled to the diffusion area, and a dummy gate structure coupled to the diffusion area. The gate structure extends a first distance beyond the diffusion area, and the dummy gate structure extends a second distance beyond the diffusion area.

29 Claims, 6 Drawing Sheets

OFF-CENTER GATE CUT

I. FIELD

The present disclosure is generally related to transistor technologies.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

A wireless device may include complementary metal oxide semiconductor (CMOS) devices that are used for different applications. For example, a wireless device may include one or more inverters, logical NOR gates, logical NAND gates, etc. Different applications may call for CMOS devices to have different driving strengths. As a non-limiting example, an application that utilizes a latch may include inverters having weak driving strengths and inverters having strong driving strengths. The driving strengths of CMOS devices may be dependent on a driving current (e.g., a source-to-drain current) in a diffusion area of a Fin-type field effect transistor (FinFET). For example, a CMOS device having a relatively large driving current (e.g., a "strong" CMOS device) may have a relatively large driving strength, and a CMOS device having a relatively small driving current (e.g., a "weak" CMOS device) may have a relatively small driving strength. However, the driving strength of CMOS devices may be difficult to tune in FinFET. For example, CMOS devices may typically include between two fins and four fins due to digitalized fin numbers. Driving current, and thus driving strength, may increase as the number of fins increases. For example, the driving strength may be proportional to the number of fins. With digitalized fin numbers, it may become increasingly difficult to realize a driving strength between integers.

III. Summary

Techniques for tuning a driving strength of a complementary metal oxide semiconductor (CMOS) device are disclosed. The CMOS device may include a gate structure, a first dummy gate structure neighboring the gate structure, and a second dummy gate structure neighboring the gate structure. The gate structure, the first dummy gate structure, and the second dummy gate structure may be coupled to an n-type field effect transistor (NFET) diffusion area of the CMOS device and to a p-type field effect transistor (PFET) diffusion area of the CMOS device. The gate structure may be cut approximately halfway between the NFET diffusion area and the PFET diffusion area (e.g., cut at a "center location"). Thus, the gate structure may extend a "first distance" from the NFET diffusion area and a substantially similar distance from the PFET diffusion area. To tune a driving current in the diffusion areas, and thus to tune the driving strength of the CMOS device, the location where the dummy gate structures are cut and the location where the gate structure is cut may vary. For example, to increase the driving current of the NFET (e.g., to increase the driving strength), the dummy gate structures may be cut at an "off-center" location that is closer to the NFET diffusion area (e.g., a "second distance" from the NFET diffusion area) than the location of the gate cut on the active NFET. To decrease the driving current (e.g., to decrease the driving strength), the dummy gate structures may be cut at an "off-center" location that is further away from the NFET diffusion area than the location of the gate cut on the active NFET.

In a particular aspect, a semiconductor device includes a diffusion area, a gate structure coupled to the diffusion area, and a dummy gate structure coupled to the diffusion area. The gate structure extends a first distance beyond the diffusion area, and the dummy gate structure extends a second distance beyond the diffusion area.

In another particular aspect, a method for tuning a driving current in a complementary metal oxide semiconductor (CMOS) device includes cutting a gate structure at a first location that is a first distance beyond a diffusion area of the CMOS device. The method also includes cutting a dummy gate structure at a second location that is a second distance beyond the diffusion area. The first gate structure is coupled to the diffusion area, and the second gate structure is coupled to the diffusion area.

In another particular aspect, a non-transitory computer-readable medium includes instructions for tuning a driving current in a complementary metal oxide semiconductor (CMOS) device. The instructions, when executed by a processor, cause the processor to initiate cutting a gate structure at a first location that is a first distance beyond a diffusion area of the CMOS device and to initiate cutting a dummy gate structure at a second location that is a second distance beyond the diffusion area. The first gate structure is coupled to the diffusion area, and the second gate structure is coupled to the diffusion area.

In another particular aspect, an apparatus includes means for cutting a gate structure at a first location that is a first distance beyond a diffusion area of a complementary metal oxide semiconductor (CMOS) device and means for cutting a dummy gate structure at a second location that is a second distance beyond the diffusion area. The first gate structure is coupled to the diffusion area, and the second gate structure is coupled to the diffusion area.

One particular advantage provided by at least one of the disclosed embodiments is an ability to tune a driving strength of a CMOS device. For example, the driving strength may be tuned by cutting poly-gates (e.g., dummy gates) of the CMOS device at an off-center location between an n-type field effect transistor (NFET) diffusion area of the CMOS device and a p-type field effect transistor (PFET) diffusion area of the CMOS device. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 3:
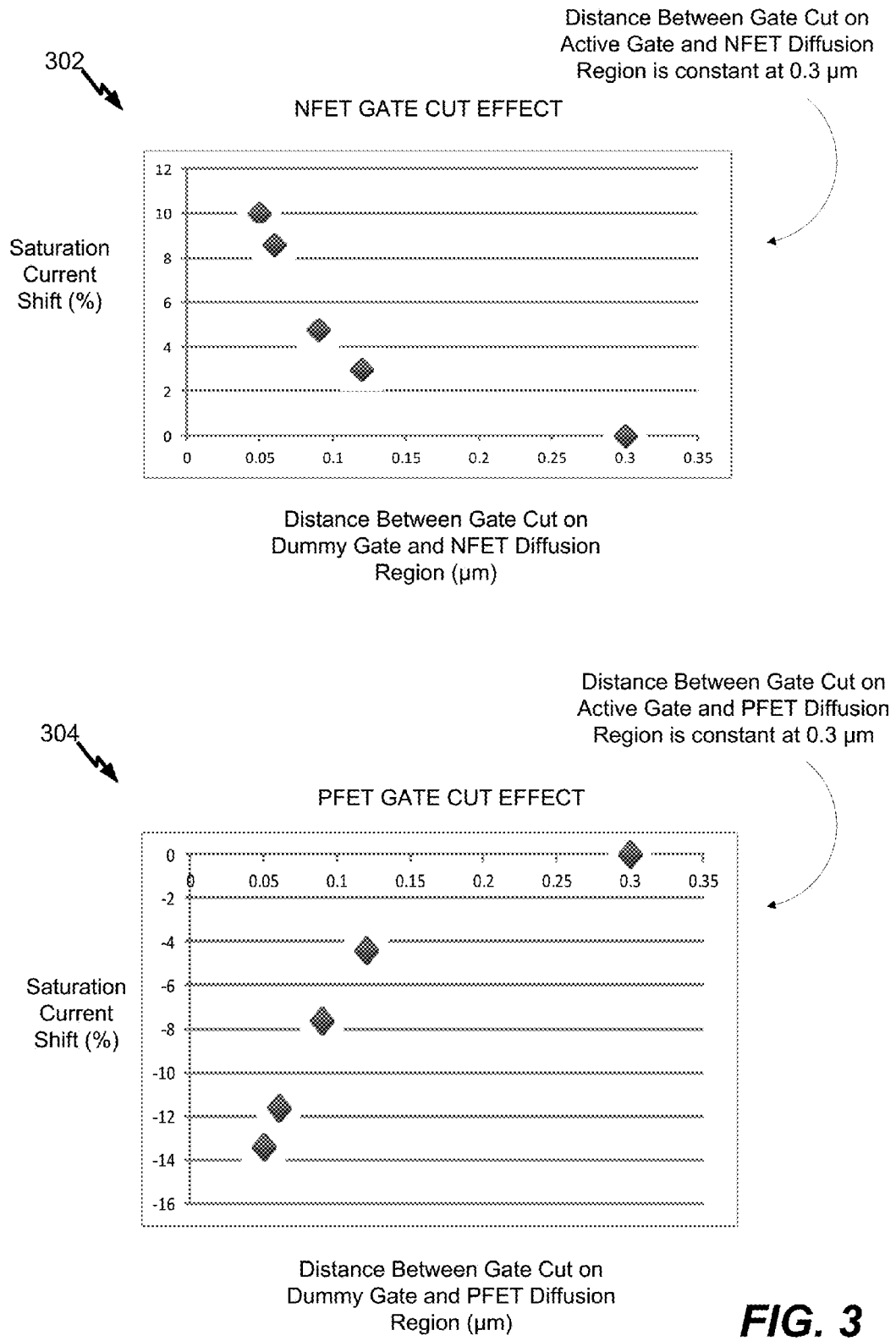
Figure 4:
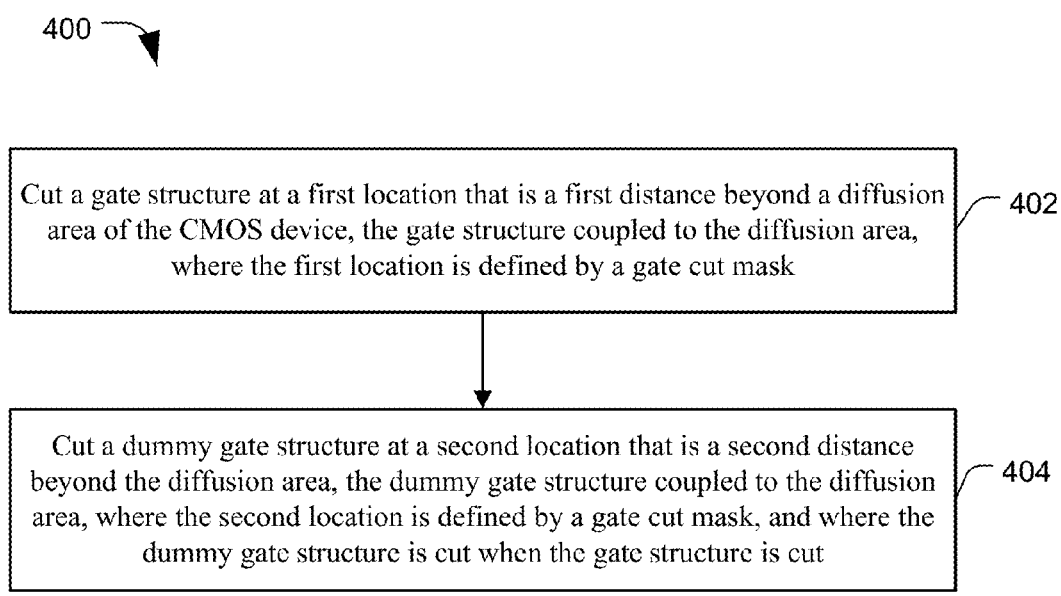
Figure 5:
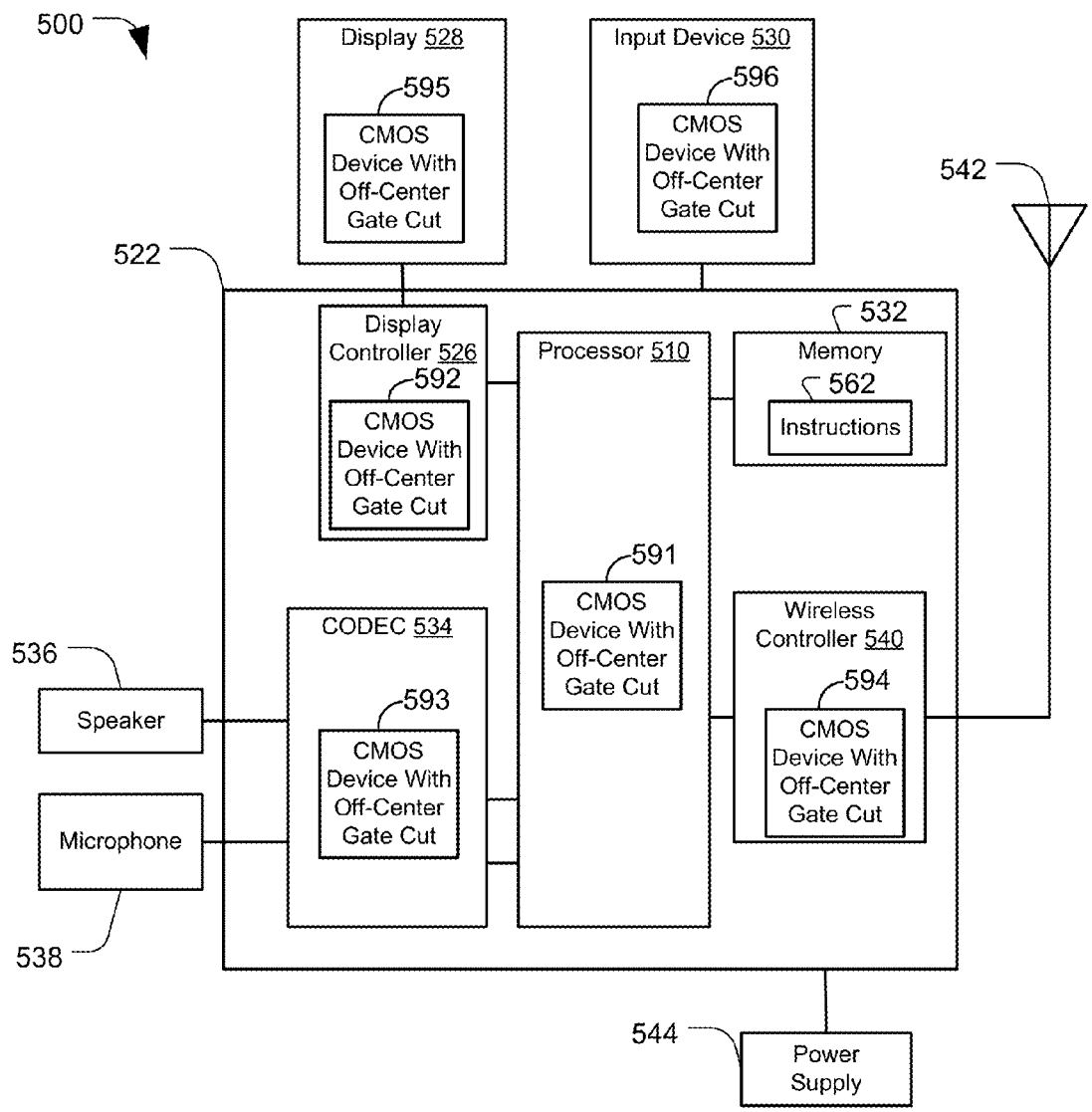
Figure 6:
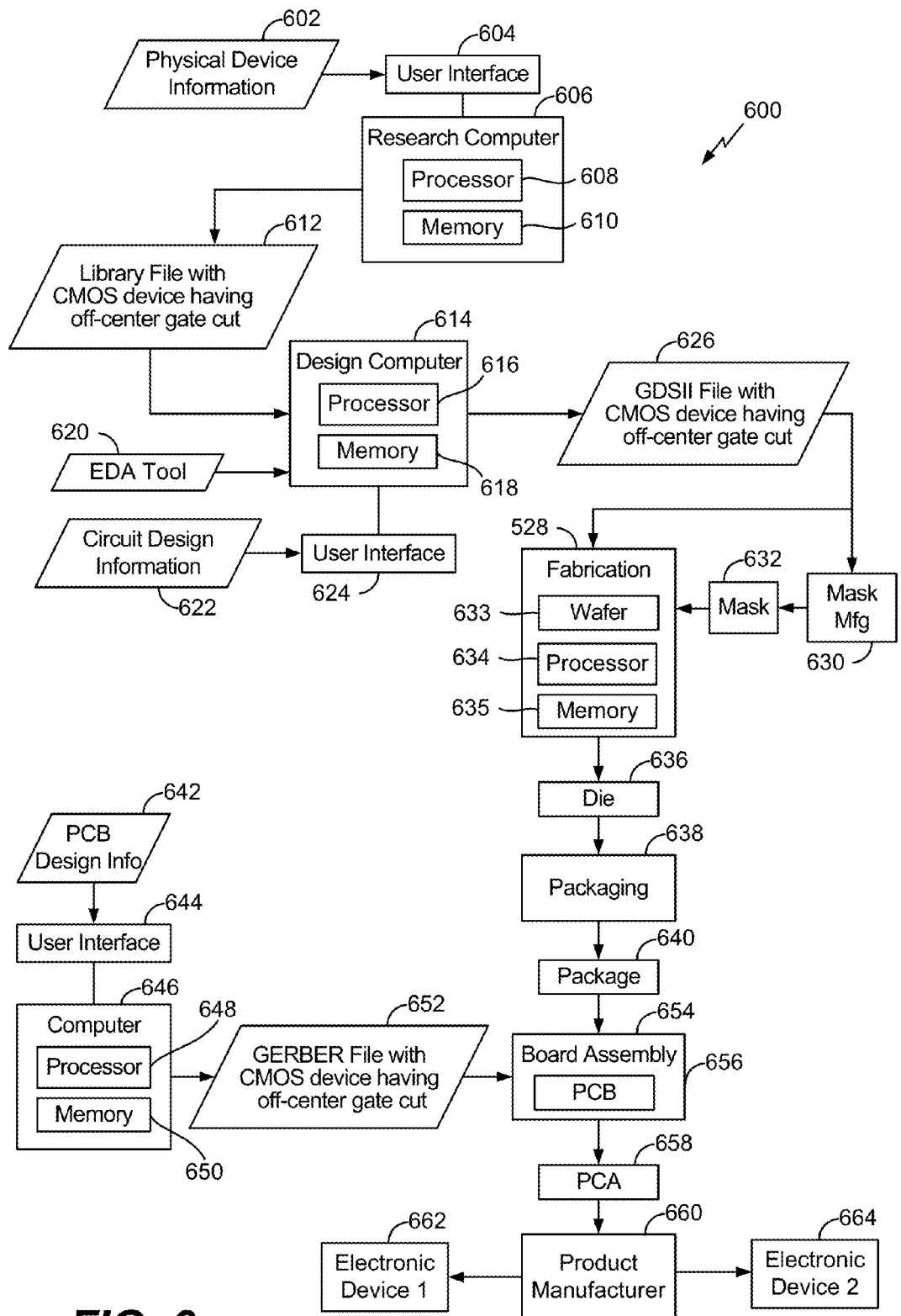

FIG. 3 includes charts that illustrate the gate cut effect for an n-type field effect transistor (NFET) device and for a p-type field effect transistor (PFET) device;

FIG. 4 is a flow chart of a particular illustrative embodiment of a method for tuning a driving current in a CMOS device;

FIG. 5 is a block diagram of a device that includes a CMOS device having an off-center gate cut; and FIG. 6 is a data flow diagram of a particular illustrative embodiment of a manufacturing process to manufacture CMOS devices based on techniques described with respect to FIGS. 1-5.

V. DETAILED DESCRIPTION

Figure 1:
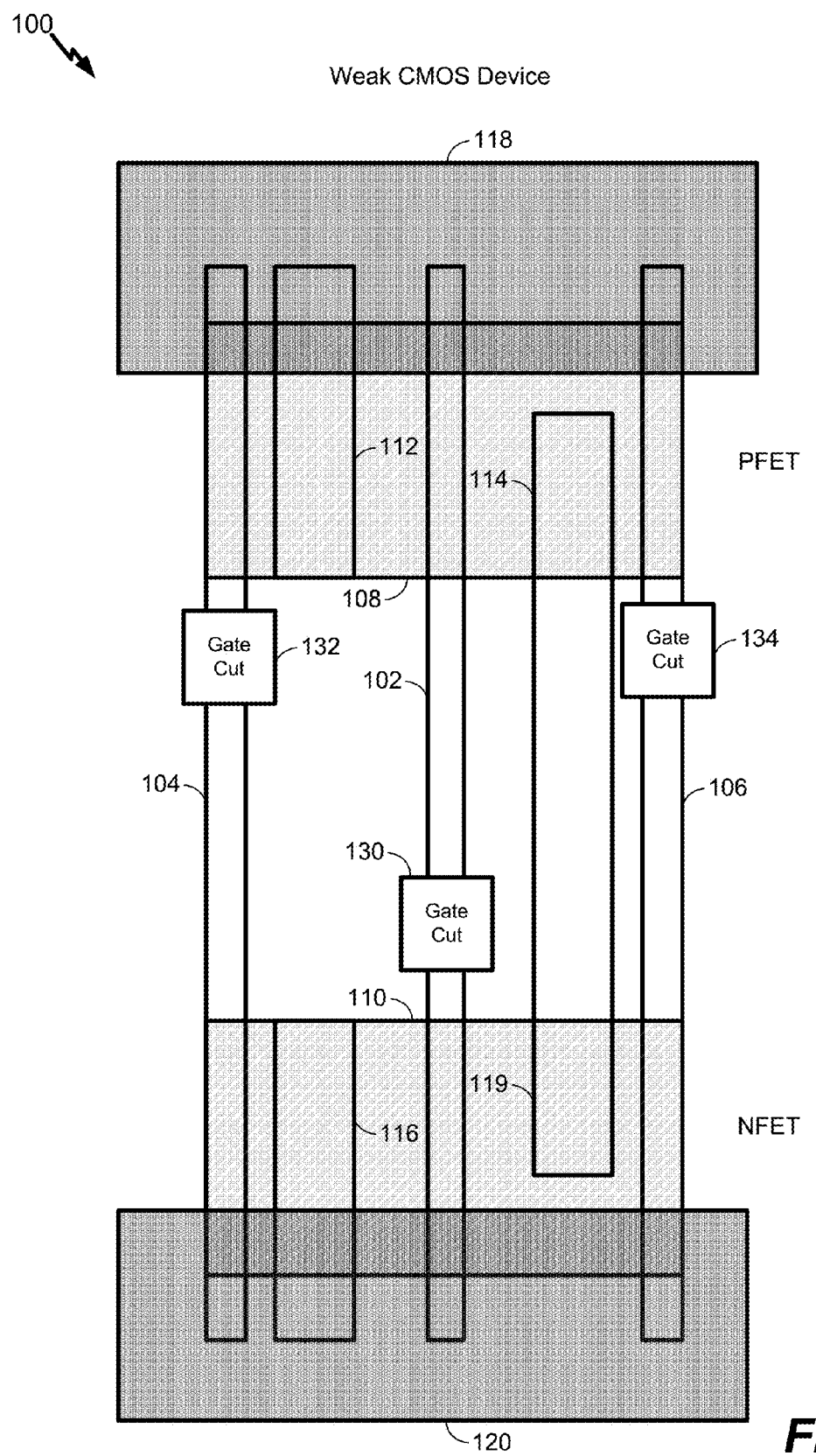
FIG. 1 is a diagram of a particular illustrative embodiment of a complementary metal oxide semiconductor (CMOS) device having an off-center gate cut.

Referring to FIG. 1, a particular illustrative embodiment of a complementary metal oxide semiconductor (CMOS) device 100 is shown. In a particular embodiment, the CMOS device 100 may be included in a logical circuit within a mobile device. For example, the CMOS device 100 may be included in an inverter, a logical NOR gate, a logical NAND gate, etc.

As described below, the CMOS device 100 may be a "weak" CMOS device. For example, the CMOS device 100 may have a relatively small driving current based on gate cut locations. In the illustrative embodiment, the CMOS device 100 may include a p-type field effect transistor (PFET) and an n-type field effect transistor (NFET). The PFET may be a p-type FinFET, and the NFET may be an n-type FinFET.

The CMOS device 100 may include a gate 102, a first dummy gate 104, and a second dummy gate 106. In a particular embodiment, a distance between the first dummy gate 104 and the gate 102 may be approximately equal to a distance between the second dummy gate 106 and the gate 102. The PFET portion of the CMOS device may include a diffusion area 108 (e.g., a PFET diffusion area), and the NFET portion of the CMOS device 100 may include a diffusion area 110 (e.g., an NFET diffusion area). In a particular embodiment, the gate 102, the dummy gates 104, 106, and the diffusion areas 108, 110 may be integrated into a semiconductor die. A source 112 of the PFET portion may be included in the diffusion area 108 and may be coupled to a first power rail 118. For example, the first power rail 118 may provide a supply voltage (Vdd) to the source 112 of the PFET portion. A drain 114 of the PFET portion may also be included in the diffusion area 108 and may be coupled to a drain 119 of the NFET portion. A source 116 of the NFET portion may be included in the diffusion area 110 and may be coupled to a second power rail 120. For example, the second power rail 120 may provide a ground voltage (Vss) to the source 116 of the NFET portion.

The amount of driving current flowing from source-to-drain in the diffusion areas 108, 110 may be based on the difference of the gate cut locations on the dummy gates 104, 106 relative to the gate cut location on the gate 102. For example, the amount of driving current in the diffusion areas 108, 110 may be relatively small when a gate cut 132 on the first dummy gate 104 and a gate cut 134 on the second dummy gate 106 are relatively close to the diffusion area 108 of the PFET (and relatively far away from the diffusion area 110 of the NFET) and a gate cut 130 on the gate 102 is relatively far from the diffusion area 108 of the PFET.

The relatively small driving current in the diffusion areas 108, 110 may cause the CMOS device 100 to be a "weak" CMOS device. For example, a "gate cut" effect (e.g., a change in driving current) occurs when a length of an active gate (e.g., the gate 102) is not equal to a length of a neighboring dummy gate. The unequal lengths may cause a "strain" on the channel region of the NFET and the PFET which may change the amount of driving current in the diffusion areas 108, 110. For PFET devices, the driving current may decrease if the active gate is longer than the dummy gates (e.g., the active gate extends a greater distance beyond the diffusion area than the dummy gates), and the driving current may increase if the active gate is shorter than the dummy gates. Thus, referring to FIG. 1, the driving current of the PFET may be relatively small because the gate 102 (with respect to the diffusion area 108) is longer than the dummy gates 104, 106 based on the locations of the gate cuts 132, 134, respectively. For example, the gate 102 may extend a first distance from the diffusion area 108 and the dummy gates 104, 106 may extend a second distance (e.g., a shorter distance) from the diffusion area 108. For NFET devices, the driving current may decrease if the active gate is shorter than the dummy gates (e.g., the active gate extends a shorter distance beyond the diffusion area than the dummy gates), and the driving current may increase if the active gate is longer than the dummy gates. Thus, referring to FIG. 1, the driving current of the NFET may be relatively small because the gate 102 (with respect to the diffusion area 110) is shorter than the dummy gates 104, 106 based on the locations of the gate cuts 132, 134, respectively. For example, the gate 102 may extend the first distance from the diffusion area 110 and the dummy gates 104, 106 may extend a third distance (e.g., a longer distance) from the diffusion area 110. The "gate cut" effect is described in greater detail with respect to FIG. 3.

In the illustrative embodiment of FIG. 1, the gate 102 may be cut at the location of the gate cut 130. Cutting may be performed during manufacturing of the CMOS device 100 (e.g., prior to integration into an integrated circuit). Thus, with respect to the PFET, the length of the gate 102 may be longer than the length of the dummy gates 104, 106 (that are cut at the locations of the gate cuts 132, 134, respectively). For example, the gate 102 may extend farther from the diffusion area 108 of the PFET than the dummy gates 104, 106. With respect to the NFET, the length of the gate 102 may be shorter than the length of the dummy gates 104, 106. For example, the dummy gates 104, 106 may extend further beyond the diffusion area 110 of the NFET than the gate 102. By cutting the dummy gates 104, 106 at locations closer to the diffusion area 108 of the PFET (and farther from the diffusion area 110 of the NFET) with respect to the location that the gate 102 is cut, the amount of driving current in the diffusion areas 108, 110 may be relatively small (e.g., weak). Reducing the driving current in the diffusion areas 108, 110 may reduce (e.g., weaken) the driving strength of the FETs in the CMOS device 100. Reducing the driving strength of the FETs in the CMOS device 100 may enable the CMOS device 100 to be used in applications calling for a CMOS device having a weak driving strength. As a non-limiting example, the CMOS device 100 may be used as a "weak invertor". It will be appreciated that a single integrated circuit may include multiple CMOS devices that are tuned to different driving strengths based on the locations of the gate cuts.

Figure 2:
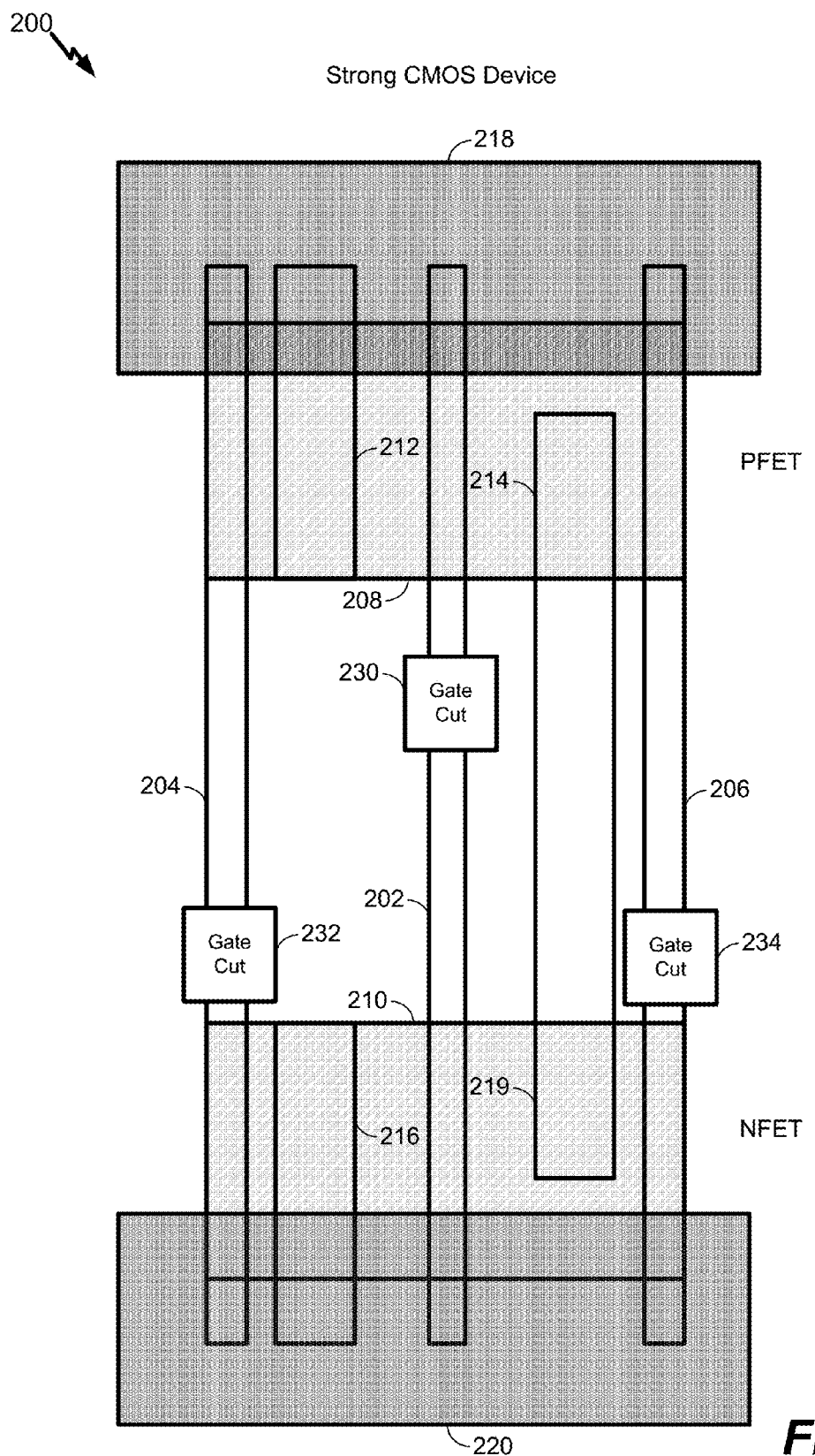
FIG. 2 is a diagram of another particular illustrative embodiment of a CMOS device having an off-center gate cut.

Referring to FIG. 2, another particular illustrative embodiment of a CMOS device 200 is shown. The CMOS device 200 may be included in a logical circuit within a mobile device. For example, the CMOS device 200 may be included in an inverter, a logical NOR gate, a logical NAND gate, etc., in a mobile device. In a particular embodiment, the CMOS device 100 of FIG. 1 and the CMOS device 200 may be integrated into a single integrated circuit.

As described below, the CMOS device 200 may be a "strong" CMOS device. For example, the CMOS device 200 may have a relatively large driving current based on gate cut locations. In the illustrative embodiment, the CMOS device 200 includes a PFET and an NFET. The PFET may be a p-type FinFET, and the NFET may be an n-type FinFET.

The CMOS device 200 may include a gate 202, a first dummy gate 204, and a second dummy gate 206. In a particular embodiment, a distance between the first dummy gate 204 and the gate 202 may be approximately equal to a distance between the second dummy gate 206 and the gate 202. The PFET portion of the CMOS device may include a diffusion area 208 (e.g., a PFET diffusion area), and the NFET portion of the CMOS device 200 may include a diffusion area 210 (e.g., an NFET diffusion area). In a particular embodiment, the gate 202, the dummy gates 204, 206, and the diffusion areas 208, 210 may be integrated into a semiconductor die. A source 212 of the PFET portion may be included in the diffusion area 208 and may be coupled to a first power rail 218. For example, the first power rail 218 may provide a supply voltage (Vdd) to the source 212 of the PFET portion. A drain 214 of the PFET portion may also be included in the diffusion area 208 and may be coupled to a drain 219 of the NFET portion. A source 216 of the NFET portion may be included in the diffusion area 210 and may be coupled to a second power rail 220. For example, the second power rail 220 may provide a ground voltage (Vss) to the source 216 of the NFET portion.

The amount of driving current flowing from source-to-drain in the diffusion areas 208, 210 may be based on the difference of the gate cut locations on the dummy gates 204, 206 relative to the gate cut location on the gate 202. For example, as illustrated in FIG. 2, the amount of driving current in the diffusion areas 208, 210 may be relatively large when a gate cut 232 on the first dummy gate 204 and a gate cut 234 on the second dummy gate 206 are relatively close to the diffusion area 210 of the NFET (and relatively far away from the diffusion area 208 of the PFET) and a gate cut 230 on the gate 202 is relatively far from the diffusion area 210 of the NFET.

The relatively large driving current in the diffusion areas 208, 210 may cause the CMOS device 200 to be a "strong" CMOS device based on the gate cut effect described above with respect to FIG. 1 and described below with respect to FIG. 3. In the illustrative embodiment of FIG. 2, the gate 202 may be cut at the location of the gate cut 230. Thus, with respect to the NFET, the length of the gate 202 may be longer than the length of the dummy gates 204, 206 (that are cut at the locations of the gate cuts 232, 234, respectively). For example, the gate 202 may extend a first distance from the diffusion area 208 and the dummy gates 204, 206 may extend a second distance (e.g., a longer distance) from the diffusion area 208. With respect to the PFET, the length of the gate 202 may be shorter than the length of the dummy gates 204, 206. By cutting the dummy gates 204, 206 at locations closer to the diffusion area 210 of the NFET (and farther from the diffusion area 208 of the PFET) with respect to the location that the gate 202 is cut, the amount of driving current in the diffusion areas 208, 210 may be relatively large (e.g., strong). For example, the gate 202 may extend the first distance from the diffusion area 210 and the dummy gates 204, 206 may extend a third distance (e.g., a shorter distance) from the diffusion area 210.

Increasing the driving current in the diffusion areas 208, 210 may increase (e.g., strengthen) the driving strength of the FETs (e.g., the NFET and the PFET) in the CMOS device 200. Increasing the driving strength of the FETs in the CMOS device 200 may enable the CMOS device 200 to be used in applications calling for a CMOS device having a strong driving strength. As a non-limiting example, the CMOS device 200 may be used as a "strong invertor". It will be appreciated that a single integrated circuit may include multiple CMOS devices that are tuned to different driving strengths based on the locations of the gate cuts.

Referring to FIG. 3, charts 302, 304 illustrating the gate cut effect for an NFET device and a PFET device, respectively, are shown. For example, a first chart 302 illustrates a change in driving current flowing from source-to-drain with respect to a distance between a dummy gate cut (e.g., the gate cuts 132, 134 of FIG. 1 and/or the gate cuts 232, 234 of FIG. 2) and an NFET diffusion area (e.g., the diffusion area 110 of FIG. 1 and/or the diffusion area 210 of FIG. 2). The second chart 304 illustrates a change in driving current flowing from source-to-drain with respect to a distance between the dummy gate cut (e.g., the gate cuts 132, 134 of FIG. 1 and/or the gate cuts 232, 234 of FIG. 2) and a PFET diffusion area (e.g., the diffusion area 108 of FIG. 1 and/or the diffusion area 208 of FIG. 2).

Referring to the first chart 302, the driving current may realize a zero percent shift (e.g., no change) when the location of the gate cut on the dummy gate is approximately 0.3 micrometers (μm) from the NFET diffusion area. The zero percent shift may be relative to a driving current where the gate cut on the dummy gate is a "centered" gate cut (e.g., equidistant from the NFET diffusion area and the PFET diffusion area). For example, the zero percent shift may be realized when the gate cuts 132, 134 of FIG. 1 are equidistant from the diffusion areas 108, 110 and/or when the gate cuts 232, 234 of FIG. 2 are equidistant from the diffusion areas 208, 210. The driving current may increase as the gate cut on the dummy gate approaches the NFET diffusion area. For example, the driving current may increase as the active gate (e.g., the gate 102 and/or the gate 202) extends a longer distance beyond the NFET diffusion area than the dummy gates (e.g., the dummy gates 104, 106 and/or the dummy gates 204, 206).

To illustrate with reference to the first chart 302, the amount of driving current flowing from source-to-drain may increase by approximately 3% when the gate cut on the dummy gate is approximately 0.12 μm from the NFET diffusion area compared to where the gate cut on the dummy gate is 0.3 μm from the NFET diffusion area. The amount of driving current flowing from source-to-drain may increase by approximately 4.6% when the gate cut on the dummy gate is approximately 0.09 μm from the NFET diffusion area compared to where the gate cut on the dummy gate is 0.3 μm from the NFET diffusion area. The amount of driving current flowing from source-to-drain may increase by approximately 8.6% when the gate cut on the dummy gate is approximately 0.07 μm from the NFET diffusion area compared to where the gate cut on the dummy gate is 0.3 μm from the NFET diffusion area. The amount of driving current flowing from source-to-drain may increase by approximately 10% when the gate cut on the dummy gate is approximately 0.05 μm from the NFET diffusion area compared to where the gate cut on the dummy gate is 0.3 μm from the NFET diffusion area.

With reference to the first chart 302, the gate cut on the active gate may be approximately 0.3 μm from the NFET diffusion area and 0.3 μm from the PFET diffusion area (e.g., halfway between the NFET diffusion area and the PFET diffusion area). Thus, for NFET devices, the driving current may increase if the active gate is longer than the dummy gates (e.g., the active gate extends a longer distance beyond the NFET diffusion area than the dummy gates). The increased driving current may be based on the unequal lengths of the active gate and the neighboring dummy gates. For example, the unequal lengths may cause a "process induced strain" on the active gate which may increase the amount of driving current in the diffusion areas. A tensile strain may enhance NFET mobility and degrade PFET mobility. A compressive strain may degrade NFET mobility and enhance PFET mobility.

Referring to the second chart 304, the driving current may also realize a zero percent shift (e.g., no change) when the location of the gate cut on the dummy gate is approximately 0.3 micrometers (μm) from the PFET diffusion area. The zero percent shift may be relative to a driving current where the gate cut is equidistant from the NFET diffusion area and the PFET diffusion area. For example, the zero percent shift may be realized when the gate cuts 132, 134 of FIG. 1 are equidistant from the diffusion areas 108, 110 and/or when the gate cuts 232, 234 of FIG. 2 are equidistant from the diffusion areas 208, 210. The driving current may decrease as the gate cut on the dummy gate approaches the PFET diffusion area.

To illustrate with reference to the second chart 304, the amount of driving current flowing from source-to-drain may decrease by approximately 4.4% when the gate cut on the dummy gate is approximately 0.12 μm from the PFET diffusion area compared to where the gate cut on the dummy gate is 0.3 μm from the PFET diffusion area. The amount of driving current flowing from source-to-drain may decrease by approximately 7.6% when the gate cut on the dummy gate is approximately 0.09 μm from the PFET diffusion area compared to where the gate cut on the dummy gate is 0.3 μm from the PFET diffusion area. The amount of driving current flowing from source-to-drain may decrease by approximately 11.6% when the gate cut on the dummy gate is approximately 0.07 μm from the PFET diffusion area compared to where the gate cut on the dummy gate is 0.3 μm from the PFET diffusion area. The amount of driving current flowing from source-to-drain may decrease by approximately 13.4% when the gate cut on the dummy gate is approximately 0.05 μm from the PFET diffusion area compared to where the gate cut on the dummy gate is 0.3 μm from the PFET diffusion area.

With reference to the second chart 304, the gate cut on the active gate may be approximately 0.3 μm from the NFET diffusion area and 0.3 μm from the PFET diffusion area (e.g., halfway between the NFET diffusion area and the PFET diffusion area). Thus, for PFET devices, the driving current may decrease if the active gate is longer than the dummy gates (e.g., the active gate extends a longer distance beyond the PFET diffusion area than the dummy gates). The increased driving current may be based on the unequal lengths of the active gate and the neighboring dummy gates. For example, the unequal lengths may cause a "process induced strain" on the active gate which may increase the amount of driving current in the diffusion areas. A tensile strain may enhance NFET mobility and degrade PFET mobility. A compressive strain may degrade NFET mobility and enhance PFET mobility.

Referring to FIG. 4, a flowchart of a particular illustrative embodiment of a method 400 for tuning driving current in a CMOS device is shown. The method 400 may be performed using the manufacturing equipment described with respect to FIG. 6.

The method 400 includes cutting a gate structure at a first location that is a first distance beyond a diffusion area of a CMOS device, at 402. The gate structure may be coupled to the diffusion area, and the first location may be defined by a gate cut mask. For example, referring to FIG. 1, the gate 102 may be cut at the location of the gate cut 130. The gate cut 130 may be located approximately halfway between the diffusion areas 108, 110. For example, the gate cut 130 may be located at the center of the CMOS device 100. Referring to FIG. 2, the gate 202 may be cut at the location of the gate cut 230. The gate cut 230 may be located approximately halfway between the diffusion areas 208, 210. For example, the gate cut 230 may be located at the center of the CMOS device 200.

A dummy gate structure may be cut at a second location that is a second distance beyond the diffusion area, at 404. The dummy structure may be coupled to the diffusion area, and the second location may be defined by the gate cut mask. For example, referring to FIG. 1, the dummy gates 104, 106 may be cut at the locations of the gate cuts 132, 134, respectively. Thus, the gate 102 may extend further beyond the diffusion area 108 of the PFET portion of the CMOS device 100 than the dummy gates 104, 106, and the dummy gates 104, 106 may extend further beyond the diffusion area 110 of the NFET portion of the CMOS device 100 than the gate 102. As a result, the driving current of the diffusion areas 108, 110 may be relatively small (based on the gate cut effect described with respect to FIG. 3) and the driving strength of the CMOS device 100 may be relatively weak. Reducing the driving strength of the FETs in the CMOS device 100 may enable the CMOS device 100 to be used in applications calling for a CMOS device having a weak driving strength. As a non-limiting example, the CMOS device 100 may be used as a "weak invertor".

As another example, referring to FIG. 2, the dummy gates 204, 206 may be cut at the locations of the gate cuts 232, 234, respectively. Thus, the gate 202 may extend further beyond the diffusion area 210 of the NFET portion of the CMOS device 200 than the dummy gates 204, 206, and dummy gates 204, 206 may extend further beyond the diffusion area 208 of the PFET portion of the CMOS device 200 than the gate 202. As a result, the driving current of the diffusion areas 208, 210 may be relatively large (based on the gate cut effect described with respect to FIG. 3) and the driving strength of the CMOS device 200 may be relatively strong. Increasing the driving strength of the FETs in the CMOS device 200 may enable the CMOS device 200 to be used in applications calling for a CMOS device having a strong driving strength. As a non-limiting example, the CMOS device 200 may be used as a "strong invertor".

The gate structure and the dummy gate structure may be cut during a single fabrication stage. For example, using the gate cut mask, the gate structure and the dummy gate structure may be cut using a single reactive ion etch (RIE) process.

Thus, the driving strength of FETs in a CMOS device may be based on a first distance between a gate cut of an active gate and the FET diffusion areas and a second distance between a gate cut of a neighboring dummy gate and the FET diffusion areas. For example, a first driving current of the diffusion areas (e.g., the diffusion areas 108, 110 of FIG. 1 and/or the diffusion areas 208, 210 of FIG. 2) may be greater than the second driving current of the diffusion areas if the distance between the gate cut of the active gate and the NFET diffusion area is greater than the distance between the gate cuts of the neighboring dummy gates and the NFET diffusion area. The first driving current may be less than the second driving current if distance between the gate cut of the active gate and the NFET diffusion area is less than the distance between the gate cuts of the neighboring dummy gates and the NFET diffusion area. The first driving current may be greater than the second driving current if the distance between the gate cut of the active gate and the PFET diffusion area is less than the distance between the gate cuts of the neighboring dummy gates and the PFET diffusion area. The first driving current may be less than the second driving current if the distance between the gate cut of the active gate and the PFET diffusion area is greater than the distance between the gate cuts of the neighboring dummy gates and the PFET diffusion area.

The method 400 of FIG. 4 may provide mechanisms to tune a driving current, and thus a driving strength, of a CMOS device. For example, a driving current may be decreased by cutting dummy gates (e.g., the dummy gates 104, 106) of a CMOS device relatively close to a PFET diffusion area of the CMOS device and by cutting an active gate (e.g., the gate 102) approximately halfway between the PFET diffusion area and an NFET diffusion area of the CMOS device. Alternatively, the driving current may be increased by cutting dummy gates (e.g., the dummy gates 204, 206) of the CMOS device relatively close to the NFET diffusion area and by cutting the active gate (e.g., the gate 202) approximately halfway between the PFET diffusion area and the NFET diffusion area. Thus, the driving current may be adjusted (e.g., "tuned") by cutting the dummy gates at an "off-center" location with respect to the PFET diffusion area and the NFET diffusion area. For example, a manufacturer may determine whether to create a CMOS device having a relatively weak driving current or a relatively strong driving current. The manufacturer may cut the active gate at a "center" location and, based on the determination, the manufacturer may cut the dummy gates at "off-center" locations. For example, to create a CMOS device having a relatively weak driving current, the manufacturer may cut the dummy gates relatively close to a PFET diffusion area. To create a CMOS device having a relatively strong driving current, the manufacturer may cut the dummy gates relatively close to an NFET diffusion area.

Referring to FIG. 5, a block diagram of a particular illustrative embodiment of an electronic device is depicted and generally designated 500. The electronic device 500 includes a processor 510, such as a digital signal processor (DSP) or a central processing unit (CPU), coupled to a memory 532.

The processor 510 may include a CMOS device 591 with an off-center gate cut. For example, the CMOS device 591 may correspond to the CMOS device 100 of FIG. 1 and/or the CMOS device 200 of FIG. 2. In a particular embodiment, the CMOS device 591 may be included in a logical device (e.g., an inverter, a logical NOR gate, a logical NAND gate, etc.) that is used to perform different applications. For example, a "weak CMOS device" (e.g., the CMOS device 100) may be used to drive a light load or to compensate node leakage. A "strong CMOS device" (e.g., the CMOS device 200) may be used to drive a heavy load, such as a clock tree. Thus, one or more CMOS devices may have different driving strengths (e.g., driving currents) to enable components of the wireless device 500 to perform different applications. It should be noted that although FIG. 5 illustrates use of the CMOS device 591 in the processor 510, this is not to be considered limiting. CMOS devices in accordance with the present disclosure, such as the CMOS device 591, may be included in any type of memory (e.g., the memory 532) of any type of electronic device. Additionally, CMOS devices in accordance with the present disclosure, such as the CMOS device 100 of FIG. 1 and/or the CMOS device 200 of FIG. 2, may be implemented in any logic circuit. For example, CMOS devices in accordance with the present disclosure may be implemented in an inverter, a logical NOR gate, a logical NAND gate, etc.

FIG. 5 shows a display controller 526 that is coupled to the processor 510 and to a display 528. The display controller 526 may include a CMOS device 592 in accordance with the present disclosure, and the display 528 may also include a CMOS device 595 in accordance with the present disclosure. A coder/decoder (CODEC) 534 can also be coupled to the processor 510. The CODEC 534 may also include a CMOS device 593 in accordance with the present disclosure. A speaker 536 and a microphone 538 can be coupled to the CODEC 534. FIG. 5 also indicates that a wireless controller 540 can be coupled to the processor 510 and to an antenna 542. The wireless controller 540 may also include a CMOS device 593 in accordance with the present disclosure. In a particular embodiment, the processor 510, the display controller 526, the memory 532, the CODEC 534, and the wireless controller 540 are included in a system-in-package or system-on-chip device (e.g., mobile station modem (MSM)) 522. In a particular embodiment, an input device 530 and a power supply 544 are coupled to the system-on-chip device 522. The input device 596 may also include a CMOS device 596 in accordance with the present disclosure. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

Although the CMOS devices 591-596 are depicted in the wireless device 500 (e.g., a mobile phone or a table computer) of FIG. 5, in other embodiments, the CMOS devices 591-596 may be included in other devices. As non-limiting examples, the CMOS devices 591-596 may be included in a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, or any other device.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as a physical property of the CMOS device 100 of FIG. 1, the CMOS device 200 of FIG.

2, the CMOS devices 591-596 of FIG. 5, or any other CMOS device having an off-center gate cut. For example, the physical device information 602 may include physical parameters, material characteristics, and structure information that is entered via a user interface 604 coupled to the research computer 606. The research computer 606 includes a processor 608, such as one or more processing cores, coupled to a computer-readable medium such as a memory 610. The memory 610 may store computer-readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices, including the CMOS device 100 of FIG. 1, the CMOS device 200 of FIG. 2, or any other CMOS device having an off-center gate cut, provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design the CMOS device 100 of FIG. 1, the CMOS device 200 of FIG. 2, the CMOS devices 591-596 of FIG. 5, or any other CMOS device having an off-center gate cut, using the library file 612. For example, a user of the design computer 614 may enter circuit design information 622 via a user interface 624 coupled to the design computer 614. The circuit design information 622 may include design information representing at least one physical property of a semiconductor device, such as the CMOS device 100 of FIG. 1, the CMOS device 200 of FIG. 2, the CMOS devices 591-596 of FIG. 5, or any other CMOS device having an off-center gate cut. To illustrate, the circuit design property may include identification of particular circuits and relationships to other elements in a circuit design, positioning information, feature size information, interconnection information, or other information representing a physical property of an electronic device. For example, the circuit design property may include gate cut positioning information on dummy gates to tune the driving current (e.g., driving strength) of CMOS devices.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the CMOS device 100 of FIG. 1, the CMOS device 200 of FIG. 2, the CMOS devices 591-596 of FIG. 5, or any other CMOS device having an off-center gate cut, in addition to other circuits or information. To illustrate, the data file may include information corresponding to the CMOS device 100 of FIG. 1, the CMOS device 200 of FIG. 2, the CMOS devices 591-596 of FIG. 5, or any other CMOS device having an off-center gate cut.

The GDSII file 626 may be received at a fabrication process 628 to manufacture a semiconductor device described with reference to FIGS. 1-5 according to transformed information in the GDSII file 626. For example, a device manufacture process may include providing the GDSII file 626 to a mask manufacturer 630 to create one or more masks, such as masks to be used with photolithography processing, illustrated in FIG. 6 as a representative mask 632. The mask 632 may be used during the fabrication process to generate one or more wafers 633, which may be tested and separated into dies, such as a representative die 636. The die 636 includes a circuit including the CMOS device 100 of FIG. 1, the CMOS device 200 of FIG. 2, the CMOS devices 591-596 of FIG. 5, or any other CMOS device having an off-center gate cut.

In a particular embodiment, the fabrication process 628 may be initiated by or controlled by a processor 634. The processor 634 may access a memory 635 that includes executable instructions such as computer-readable instructions or processor-readable instructions. The executable instructions may include one or more instructions that are executable by a computer, such as the processor 634.

The fabrication process 628 may be implemented by a fabrication system that is fully automated or partially automated. For example, the fabrication process 628 may be automated and may perform processing steps according to a schedule. The fabrication system may include fabrication equipment (e.g., processing tools) to perform one or more operations to form an electronic device. During the fabrication process, a reactive ion etch (RIE) may be performed to cut gate structures and dummy gate structures according to the techniques described with respect to FIGS. 1-4.

The fabrication system may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 634.

Alternatively, the processor 634 may be a part of a high-level system, subsystem, or component of the fabrication system. In another embodiment, the processor 634 includes distributed processing at various levels and components of a fabrication system.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged electronic device on a circuit board, the packaged electronic device corresponding to the package 640 including the CMOS device 100 of FIG. 1, the CMOS device 200 of FIG. 2, the CMOS devices 591-596 of FIG. 5, or any other CMOS device having an off-center gate cut.

The computer 646 may be configured to transform the PCB design information 642 to generate a data file, such as a GERBER file 652 with data that includes physical positioning information of a packaged electronic device on a circuit board, as well as layout of electrical connections such as traces and vias, where the packaged electronic device corresponds to the package 640 including the CMOS device 100 of FIG. 1, the CMOS device 200 of FIG. 2, the CMOS devices 591-596 of FIG. 5, or any other CMOS device having an off-center gate cut. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacturer 660 and integrated into one or more electronic devices, such as a first representative electronic device 662 and a second representative electronic device 664. As an illustrative, non-limiting example, the first representative electronic device 662, the second representative electronic device 664, or both, may be selected from a mobile phone, a tablet, a communications device, a personal digital assistant (PDA), a music player, a video player, an entertainment unit, a navigation device, a fixed location data unit, and a computer, into which the CMOS device 100 of FIG. 1, the CMOS device 200 of FIG. 2, the CMOS devices 591-596 of FIG. 5, or any other CMOS device having an off-center gate cut, is integrated. As another illustrative, non-limiting example, one or more of the electronic devices 662 and 664 may be remote units such as hand-held personal communication systems (PCS) units, portable data units such as personal data assistants, global positioning system (GPS) enabled devices, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the CMOS device 100 of FIG. 1, the CMOS device 200 of FIG. 2, the CMOS devices 591-596 of FIG. 5, or any other CMOS device having an off-center gate cut, may be fabricated, processed, and incorporated into an electronic device, as described in the illustrative manufacturing process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. The process 600 of FIG. 6 may be performed by a single entity or by one or more entities performing various stages of the manufacturing process 600.

In conjunction with the described aspects, an apparatus includes means for cutting a gate structure at a first location that is a first distance beyond a diffusion area of a CMOS device. The gate structure may be coupled to the diffusion area. For example, the means cutting the gate structure may include one or more components of the manufacturing equipment in FIG. 6.

The apparatus also includes means for cutting a dummy gate structure at a second location that is a second distance beyond the diffusion area. The dummy gate structure may be coupled to the diffusion area. For example, the means for cutting the dummy gate structure may include one or more components of the manufacturing equipment in FIG. 6.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A semiconductor device comprising:
a diffusion area;
a second diffusion area;
a gate structure coupled to the diffusion area and to the second diffusion area, the gate structure having a first edge at a first location that is a first distance beyond the diffusion area; and
a dummy gate structure coupled to the diffusion area and to the second diffusion area, the dummy gate structure having a second edge at a second location that is a second distance beyond the diffusion area, wherein the second distance is different than the first distance, and wherein the first edge and the second edge are each between the diffusion area and the second diffusion area.

2. The semiconductor device of claim 1, wherein the diffusion area, the second diffusion area, the gate structure, and the dummy gate structure are included in a complementary metal oxide semiconductor (CMOS) device.

3. The semiconductor device of claim 1, wherein the dummy gate structure extends a third distance beyond the second diffusion area.

4. The semiconductor device of claim 1, wherein the diffusion area is an n-type diffusion area of a complementary metal oxide semiconductor (CMOS) device, and wherein the second diffusion area is a p-type diffusion area of the CMOS device.

5. The semiconductor device of claim 4, wherein a first driving current of the diffusion area and the second diffusion area is greater than a second driving current of the diffusion area and the second diffusion area if the first distance is greater than the second distance, and wherein the first driving current is less than the second driving current if the first distance is less than the second distance.

6. The semiconductor device of claim 4, wherein a first driving current of the diffusion area and the second diffusion area is greater than a second driving current of the diffusion area and the second diffusion area if the first distance is less than the third distance, and wherein the first driving current is less than the second driving current if the first distance is greater than the third distance.

7. The semiconductor device of claim 1, wherein the diffusion area is a p-type diffusion area of a CMOS device, and wherein the second diffusion area is an n-type diffusion area of the CMOS device.

8. The semiconductor device of claim 7, wherein a first driving current of the diffusion area and the second diffusion area is greater than a second driving current of the diffusion area and the second diffusion area if the first distance is less than the second distance, and wherein the first driving current is less than the second driving current if the first distance is greater than the second distance.

9. The semiconductor device of claim 7, wherein a first driving current of the diffusion area and the second diffusion area is less than a second driving current of the diffusion area and the second diffusion area if the first distance is less than the third distance, and wherein the first driving current is greater than the second driving current if the first distance is greater than the third distance.

10. The semiconductor device of claim 1, further comprising a second dummy gate structure coupled to the diffusion area, the second dummy gate structure extending the second distance beyond the diffusion area.

11. The semiconductor device of claim 1, further comprising a device selected from the group consisting of a mobile phone, a personal digital assistant (PDA), a tablet, a music player, a video player, an entertainment unit, a navigation device, a communications device, a fixed location data unit, and a computer, the semiconductor device comprising at least one semiconductor die that includes the diffusion area, the second diffusion area, the gate structure, and the dummy gate structure.

12. A method of forming a complementary metal oxide semiconductor (CMOS) device, the method comprising:
cutting a gate structure at a first location that is a first distance beyond a diffusion area of the CMOS device, the gate structure coupled to the diffusion area; and
cutting a dummy gate structure at a second location that is a second distance beyond the diffusion area, the dummy gate structure coupled to the diffusion area, wherein the first location and the second location are between the diffusion area and a second diffusion area of the CMOS device, the gate structure coupled to the second diffusion area.

13. The method of claim 12, further comprising cutting a second dummy gate structure at a third location that is the second distance beyond the diffusion area, the second dummy gate structure coupled to the diffusion area.

14. The method of claim 12, wherein the dummy gate structure is coupled to the second diffusion area of the CMOS device, and wherein the dummy gate structure extends a third distance beyond the second diffusion area.

15. The method of claim 12, wherein the diffusion area is an n-type diffusion area of the CMOS device, and wherein the second diffusion area is a p-type diffusion area of the CMOS device.

16. The method of claim 15, wherein a first driving current of the diffusion area and the second diffusion area is greater than a second driving current of the diffusion area and the second diffusion area if the first distance is greater than the second distance, and wherein the first driving current is less than the second driving current if the first distance is less than the second distance.

17. The method of claim 15, wherein a first driving current of the diffusion area and the second diffusion area is greater than a second driving current of the diffusion area and the second diffusion area if the first distance is less than the third distance, and wherein the first driving current is less than the second driving current if the first distance is greater than the third distance.

18. The method of claim 12, wherein the diffusion area is a p-type diffusion area of the CMOS device, and wherein the second diffusion area is an n-type diffusion area of the CMOS device.

19. The method of claim 18, wherein a first driving current of the diffusion area and the second diffusion area is greater than a second driving current of the diffusion area and the second diffusion area if the first distance is less than the second distance, and wherein the first driving current is less than the second driving current if the first distance is greater than the second distance.

20. The method of claim 18, wherein a first driving current of the diffusion area and the second diffusion area is less than a second driving current of the diffusion area and the second diffusion area if the first distance is less than the third distance, and wherein the first driving current is greater than the second driving current if the first distance is greater than the third distance.

21. The method of claim 12, wherein cutting the gate structure and cutting the dummy gate structure is initiated at a processor integrated into an electronic device.

22. A non-transitory computer-readable medium comprising instructions to form a complementary metal oxide semiconductor (CMOS) device, the instructions, when executed by a processor, cause the processor to:
   initiate cutting a gate structure at a first location that is a first distance beyond a diffusion area of the CMOS device, the gate structure coupled to the diffusion area; and
   initiate cutting a dummy gate structure at a second location that is a second distance beyond the diffusion area, the dummy gate structure coupled to the diffusion area, wherein the first location and the second location are between the diffusion area and a second diffusion area of the CMOS device, the gate structure coupled to the second diffusion area.

23. The non-transitory computer-readable medium of claim 22, further comprising instructions that, when executed by the processor, cause the processor to initiate cutting a second dummy gate structure at a third location that is the second distance beyond the diffusion area, the second dummy gate structure coupled to the diffusion area.

24. The non-transitory computer-readable medium of claim 22, wherein the dummy gate structure is coupled to the second diffusion area, and wherein the dummy gate structure extends a third distance beyond the second diffusion area.

25. The non-transitory computer-readable medium of claim 22, wherein the diffusion area is an n-type diffusion area of the CMOS device, and wherein the second diffusion area is a p-type diffusion area of the CMOS device.

26. The non-transitory computer-readable medium of claim 22, wherein the diffusion area is a p-type diffusion area of the CMOS device, and wherein the second diffusion area is an n-type diffusion area of the CMOS device.

27. An apparatus comprising:
   means for cutting a gate structure at a first location that is a first distance beyond a diffusion area of a complementary metal oxide semiconductor (CMOS) device, the gate structure coupled to the diffusion area; and
   means for cutting a dummy gate structure at a second location that is a second distance beyond the diffusion area, the dummy gate structure coupled to the diffusion area, wherein the first location and the second location are between the diffusion area and a second diffusion area of the CMOS device, the gate structure coupled to the second diffusion area.

28. The apparatus of claim 27, further comprising means for cutting a second dummy gate structure at a third location that is the second distance beyond the diffusion area, the second dummy gate structure coupled to the diffusion area.

29. The apparatus of claim 27, wherein the dummy gate structure is coupled to the second diffusion area, and wherein the dummy gate structure extends a third distance beyond the second diffusion area.

* * * * *